United States Patent [19]
Hasegawa et al.

[11] Patent Number: 5,359,241
[45] Date of Patent: Oct. 25, 1994

[54] ECL CIRCUIT

[75] Inventors: Koichi Hasegawa; Tetsuya Iga, both of Itami, Japan

[73] Assignee: Mitsubishi Denki Kabushiki Kaisha, Tokyo, Japan

[21] Appl. No.: 54,192

[22] Filed: Apr. 30, 1993

[30] Foreign Application Priority Data

May 13, 1992 [JP] Japan .................................. 4-120478
Oct. 1, 1992 [JP] Japan .................................. 4-263313

[51] Int. Cl.⁵ ................ H03K 19/086; H03K 19/0175
[52] U.S. Cl. ...................................... 307/455; 307/475
[58] Field of Search ............... 307/455, 272.2, 443, 307/475

[56] References Cited

U.S. PATENT DOCUMENTS

| | | | |
|---|---|---|---|
| 4,516,039 | 5/1985 | Matsuzaki et al. | 307/443 |
| 4,714,841 | 12/1987 | Shoji et al. | 307/475 |
| 4,853,899 | 8/1989 | Kitsukawa et al. | 307/475 |
| 4,939,393 | 7/1990 | Petty | 307/455 |
| 4,970,406 | 11/1990 | Fitzpatrick et al. | 307/272.2 |
| 5,001,361 | 3/1991 | Tamamura et al. | 307/272.2 |
| 5,099,142 | 3/1992 | Barre | 307/455 |
| 5,124,589 | 6/1992 | Shiomi et al. | 307/475 |

*Primary Examiner*—Edward P. Westin
*Assistant Examiner*—Jon Santamauro
*Attorney, Agent, or Firm*—Oblon, Spivak, McClelland, Maier & Neustadt

[57] ABSTRACT

A flip-flop circuit of ECL structure includes an ECL circuit portion and a level shift circuit portion including a circuit having a pair of resistors. The ECL circuit portion applies a differential signal to one end of each of the resistors, and Q and/Q output signals are derived from the other ends of each of the resistors. The amount of level shift down of the signals when shifted by the resistors is enabled to be set to any relatively small amount, whereby the ECL circuit is permitted to operate at a low voltage.

7 Claims, 8 Drawing Sheets

ECL CIRCUIT

BACKGROUND OF THE INVENTION

1. Field of the Invention

The present invention relates to an ECL (or CML) circuit and more particularly to an ECL circuit permitted to operate at a low voltage.

2. Description of the Background Art

FIG. 5 is a block diagram of a conventional frequency divider. The frequency divider 1 comprises a multiplicity of connected flip-flop circuits 2. A first flip-flop circuit 2 receives a clock signal CLK and also receives a ground potential through a coupling capacitance 3. Outputs Q and $\overline{Q}$ of the first flip-flop circuit 2 are inputted to inputs T and $\overline{T}$ of a second flip-flop circuit 2. In this fashion, outputs of a flip-flop circuit are sequentially propagated to inputs of the next flip-flop circuit until outputs Q and $\overline{Q}$ of the last flip-flop circuit 2 output a clock signal and an inverted clock signal which are obtained by frequency-dividing the clock signal CLK.

FIG. 6 is a circuit diagram of a flip-flop circuit of ECL structure in the form of an integrated circuit on a semiconductor chip. The flip-flop circuit 2 of FIG. 6 comprises an ECL circuit portion 11, and a buffer circuit portion 300.

The ECL circuit portion 100 comprises a differential pair of NPN transistors 11 and 12 in a master portion and a differential pair of NPN transistors 13 and 14 in a slave portion. The base of the transistor 11 is connected to a $\overline{T}$ input terminal, and the base of the transistor 12 is connected to a T input terminal. The base of the transistor 13 is connected to the $\overline{T}$ input terminal, and the base of the transistor 14 is connected to the T input terminal. The emitters of the transistors 11 and 12 are connected in common, and the common connection is grounded through a constant-current source NPN transistor 15 for supplying an operating bias current of the master potion and through a resistor 17. The emitters of the transistors 13 and 14 are connected in common, and the common connection is grounded through a constant-current source NPN transistor 16 for supplying an operating bias current of the slave portion and through a resistor 18. The bases of the transistors 15 and 16 are connected in common to a $V_{CB}$ terminal. A common base potential $V_{CB}$ generated in a bias circuit (not shown) is applied as a control potential to the $V_{CB}$ terminal.

In the master potion, a differential pair of NPN transistors 19 and 20 are connected to the collector of the transistor 11, and a differential pair of NPN transistors 21 and 22 are connected to the collector of the transistor 12. In the slave portion, a differential pair of NPN transistors 23 and 24 are connected to the collector of the transistor 13, and a differential pair of NPN transistors 25 and 26 are connected to the collector of the transistor 14.

The emitters of the transistors 19 and 20 are connected in common to the collector of the transistor 11. The base of the transistor 19 is connected to the collector of the transistor 20, and the base of the transistor 20 is connected to the collector of the transistor 19. The emitters of the transistors 21 and 22 are connected in common to the collector of the transistor 12. The collector of the transistor 21 is connected to the collector of the transistor 19 and is connected to a power supply potential $V_{CC}$ through a node N1 and a resistor 27. The base of the transistor 271 is connected to the power supply potential $V_{CC}$ through a node N4 and a resistor 30. The collector of the transistor 22 is connected to the collector of the transistor 20 and is connected to the power supply potential $V_{CC}$ through a node N2 and a resistor 28. The base of the transistor 22 is connected to the power supply potential $V_{CC}$ through anode N3 and a resistor 29.

The emitters of the transistors 25 and 26 are connected in common to the collector of the transistor 14. The base of the transistor 25 is connected to the collector of the transistor 26, and the base of the transistor 26 is connected to the collector of the transistor 25. The emitters of the transistors 23 and 24 are connected in common to the collector of the transistor 13. The collector of the transistor 23 is connected to the collector of the transistor 25 and is connected to the power supply potential $V_{CC}$ through the node N3 and the resistor 29. The base of the transistor 23 is connected to the power supply potential $V_{CC}$ through the node N1 and the resistor 27. The collector of the transistor 24 is connected to the collector of the transistor 26 and is connected to the power supply potential $V_{CC}$ through the node N4 and the resistor 30. The base of the transistor 24 is connected to the power supply potential $V_{CC}$ through the node N2 and the resistor 28.

The buffer circuit portion 300 comprises emitter follower NPN transistors 38 and 39. The base of the transistor 38 is connected to the node N3, and the collector thereof is connected to the power supply potential $V_{CC}$. The base of the transistor 39 is connected to the node N4, and the collector thereof is connected to the power supply potential $V_{CC}$. The emitter of the transistor 38 is connected to a $\overline{Q}$ output terminal and is grounded through a constant-current source NPN transistor 40 and a resistor 42. The emitter of the transistor 39 is connected to a Q output terminal and is grounded through a constant-current source NPN transistor 41 and a resistor 43. The bases of the transistors 40 and 41 are connected to the $V_{CB}$ terminal in common with the bases of the transistors 15 and 16.

The operation of the flip-flop circuit 2 of FIG. 6 is classified into four modes to be described below.

In a first mode, input/output levels are as follows: T="L", $\overline{T}$="H", Q="L", and $\overline{Q}$="H". At that time, the transistors 11, 13, 19 and 24 turn on. This provides a current path of resistor 27—transistor 19—transistor 11—transistor 15—resistor 17, and a current path of resistor 30—transistor 24—transistor 13—transistor 16—resistor 18. The levels at the nodes N1, N2, N3 and N4 are "L", "H", "H" and "L", respectively.

In a second mode, input/output levels are as follows: T="H", $\overline{T}$="L", Q="L", and $\overline{Q}$="H". At that time, the transistors 12, 14, 22 and 26 turn on. This provides a current path of resistor 28—transistor 22—transistor 12—transistor 15—resistor 17, and a current path of resistor 30—transistor 26—transistor 14—transistor 16—resistor 18. The levels at the nodes N1, N2, N3 and N4 are "H", "L", "H" and "L", respectively.

In a third mode, input/output levels are as follows: T="L", $\overline{T}$="H", Q="H", and $\overline{Q}$="L". At that time, the transistors 11, 13, 20 and 23 turn on. This provides a current path of resistor 28—transistor 20—transistor 11—transistor 15—resistor 17, and a current path of resistor 29—transistor 23—transistor 13—transistor 16—resistor 18. The levels at the nodes N1, N2, N3 and N4 are "H", "L", "L" and "H", respectively.

In a fourth mode, input/output levels are as follows: T="H", $\overline{T}$="L", Q="H", and $\overline{Q}$="L". At that time, the transistors 12, 14, 21 and 25 turn on. This provides a current path of resistor 27—transistor 21—transistor 12—transistor 15—resistor 17, and a current path of resistor 29—transistor 25—transistor 14—transistor 16—resistor 18. The levels at the nodes N1, N2, N3 and N4 are "L", "H", "L" and "H", respectively.

By repeating the first to fourth modes in order, the signals inputted to the T and $\overline{T}$ input terminals are frequency-divided to half, and the resultant signals are outputted from the Q and $\overline{Q}$ output terminals. The signals at the Q and $\overline{Q}$ output terminals are inputted to the T and $\overline{T}$ input terminals of the succeeding flip-flop circuit 2. A need exists at that time for provision of the Q and $\overline{Q}$ output signals at a potential level which does not allow the respective transistors of the succeeding flip-flop circuit 2 to enter 8 saturation region, which will be described below.

In the second mode, for example, the signals at the "H" and "L" levels are inputted to the T and $\overline{T}$ input terminals, respectively. The "H" level applied to the T input terminal is derived from the Q output terminal of the preceding flip-flop circuit 2. A potential $V_{Q(H)}$ at the "H" level is expressed as:

$$V_{Q(H)} = V_{CC} - V_{BE} \tag{1}$$

where $V_{BE}$ is a base-emitter voltage of a transistor.

At this time, an emitter potential $V_{E12}$ of the transistor 12 is:

$$V_{E12} = V_{Q(H)} - V_{BE} = V_{CC} - 2V_{BE} \tag{2}$$

Taking into consideration the base-emitter voltage $V_{BE}$ of the transistor 22 that is on, a collector potential $V_{C12}$ of the transistor 12 is:

$$V_{C12} = V_{CC} - V_{BE} \tag{3}$$

From Expressions (2) and (3), a collector-emitter voltage $V_{CE12}$ of the transistor 12 is given as:

$$V_{CE12} = V_{C12} - V_{E12} = V_{BE} \tag{4}$$

FIG. 7 illustrates an operating characteristic of general transistors, the abscissa being the collector-emitter voltage $V_{CE}$, the ordinate being a collector current $I_C$. To operate a transistor in an active region, not in the saturation region, it is necessary that the collector-emitter voltage $V_{CE}$ is not less than a saturation voltage $V_{SAT}$.

For non-saturation of the transistor 12, it is necessary to satisfy the following condition:

$$V_{CE12} > V_{SAT} \tag{5}$$

From Expression (4) is derived:

$$V_{BE} > V_{SAT} \tag{6}$$

This is the first requirement.

On the other hand, a collector potential $V_{C15}$ of the transistor 15 is:

$$V_{C15} = V_{E12} = V_{CC} - 2V_{BE} \tag{7}$$

The emitter potential $V_{E15}$ of the transistor 15 is:

$$V_{E15} = V_{CB} - V_{BE} \tag{8}$$

Thus a collector-emitter voltage $V_{CE15}$ of the transistor 15 is given as:

$$V_{CE15} = V_{C15} - V_{E15} = V_{CC} - V_{CB} - V_{BE} \tag{9}$$

For non-saturation of the transistor 15, it is necessary to satisfy the following condition:

$$V_{CE15} > V_{SAT} \tag{10}$$

From Expression (9) is derived:

$$V_{CC} > V_{CB} + V_{BE} + V_{SAT} \tag{11}$$

This is the second requirement.

Generally $V_{BE} = 0.75$ V and $V_{SAT} = 0.3$ V. The potential $V_{CB}$ requires at least the amount of on-voltage of the constant-current source transistor 15, so that it is necessary that $V_{CB} = 1$ V when the temperature characteristics of the on-voltage are taken into consideration. Substituting these values in Expression (11) indicative of the second requirement, then:

$$V_{CC} > 1 + 0.75 + 0.3 = 2.05(V) \tag{12}$$

That is, the power supply voltage $V_{CC}$ of the flip-flop circuits 2 must be more than 2.05 V in order that the respective transistors are not saturated but operate in the active region.

The first requirement indicated by Expression (6) is constantly satisfied independently of the power supply voltage $V_{CC}$.

Although the above description is associated with the transistor 12, the same is true for the other transistors 11, 13 and 14.

If the power supply voltage $V_{CC}$ is less than 2.05 V, the transistors 11, 12, 13, 14 are saturated to cause switching delay, resulting in abnormal operation of the flip-flop circuits 2.

The frequency divider 1 of FIG. 5 is in sonic cases used for a device 4 driven by a battery such as a portable telephone as tier example shown in FIG. 8. The power supply voltage $V_{CC}$ of the frequency divider 1 is, as above described, limited to $V_{CC} > 2.05$ V. An external battery 5 of the device 4 might have a relatively low voltage. In such a case it is necessary to provide a booster circuit 6 in the device 4 to satisfy the condition of $V_{CC} > 2.05$ V. This presents a problem of complexity of device structure.

SUMMARY OF THE INVENTION

According to the present invention, an ECL circuit comprises: an ECL circuit portion having an ECL structure for driving first and second differential signals; and a buffer circuit portion including a differential pair of first and second transistors having control electrodes receiving the first and second signals, respectively, and first electrodes connected in common for buffering the first and second signals to output the buffered first and second signals.

Since the buffer circuit portion includes the differential pair of transistors receiving at their control electrodes the first and second signals to be buffered, the amount of level shift down of the first and second signals when buffered is set to any relatively small amount. This is effective in that, when a succeeding similar ECL circuit is connected to the present ECL circuit, a low voltage operation is enabled.

Preferably, the buffer circuit portion includes an inverting buffer circuit, and the inverting buffer circuit includes a first output terminal connected to a second electrode of the first transistor and a second output terminal connected to a second electrode of the second transistor.

Since the buffer circuit portion includes the inverting buffer circuit for deriving outputs from the second electrodes of the first and second transistors, the structure of the buffer circuit portion is relatively simplified.

Preferably, the inverting buffer circuit further includes: a power supply line for supplying a predetermined power supply potential; a first resistor having a first end connected to the second electrode of the first transistor and a second end coupled to the power supply line; and a second resistor having a first end connected to the second electrode of the second transistor and a second end coupled to the power supply line.

The first and second resistors are provided between the second electrodes of the first and second transistors and the power supply line. Thus the logical amplitude of the output signal is set to any level by varying the resistances of the first and second resistors.

Preferably, the inverting buffer circuit further includes a third resistor having a first end connected in common to the second ends of the first and second resistors and a second end connected to the power supply line.

The third resistor is connected between the second ends of the first and second resistors and the power supply line. Thus the potential level of the output signal is set to any level by varying the resistance of the third resistor.

Preferably, the inverting buffer circuit further includes a first constant-current source transistor connected to a common connection of the first electrodes of the first and second transistors.

Preferably, the ECL circuit portion includes a master portion, a slave portion, and second and third constant-current source transistors for applying an operating bias current to the master and slave portions, respectively, and the first to third constant-current source transistors include control electrodes connected in common to a predetermined control potential.

According to another aspect of the present invention, an ECL circuit comprises: an ECL circuit portion having an ECL structure for deriving first and second differential signals; and a level shift circuit portion for level-shifting the first and second signals to output the level-shifted first and second signals.

Since the level shift circuit portion shifts the level of the first and second signals to output the resultant signals, the amount of level shift of the first and second signals may be set to any amount. This is effective in that, when a succeeding similar ECL circuit is connected to the present ECL circuit, a low voltage operation is enabled.

Preferably, the level shift circuit portion includes: a first resistor having a first end receiving the first signal; a second resistor having a first end receiving the second signal; a first constant-current source connected to a second end of the first resistor; and a second constant-current source connected to a second end of the second resistor.

Since the level-shift circuit portion includes the first and second resistors and the first and second constant-current sources, the structure of the level shift circuit portion is relatively simplified. The amount of level shift is set easily to any amount by means of the current values of the first and second constant-current sources and the resistances of the first and second resistors.

Preferably, the first and second constant-current sources include first and second constant-current source transistors, respectively, the ECL circuit portion includes a master portion, a slave portion, and third and fourth constant-current source transistors for applying an operating bias current to the master and slave portions, respectively, and the first to fourth constant-current source transistors include control electrodes connected in common to a predetermined control potential.

Preferably, the ECL circuit portion includes a master portion, a slave portion, and a power supply line for supplying a predetermined power supply potential, and the master portion includes first and second signal output ends for outputting opposite-polarity signals, a first resistor having a first end connected to the first signal output end, a second resistor having a first end connected to the second signal output end, and a third resistor having a first end connected in common to second ends of the first and second resistors and a second end connected to the power supply line.

Preferably, the slave portion includes first and second signal output ends for outputting opposite-polarity signals, a fourth resistor connected between the first signal output end of the slave portion and the power supply line, and a fifth resistor connected between the second signal output end of the slave portion and the power supply line, and the first to fifth resistors have an equal resistance.

Preferably, the ECL circuit portion includes a master portion and a slave portion, and the master portion includes first and second signal output ends for outputting opposite-polarity signals, and the ECL circuit further includes another level shift circuit connected to the first and second signal output ends for controlling levels of the opposite-polarity signals outputted from the first and second signal output ends.

Preferably, the latter level shift circuit includes: a first resistor having a first end receiving one of the opposite-polarity signals; a second resistor having a first end receiving the other opposite-polarity signal; a first constant-current source connected to a second end of the first resistor; and a second constant-current source connected to a second end of the second resistor.

An object of the present invention is to provide an ECL circuit permitted to operate at a low voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
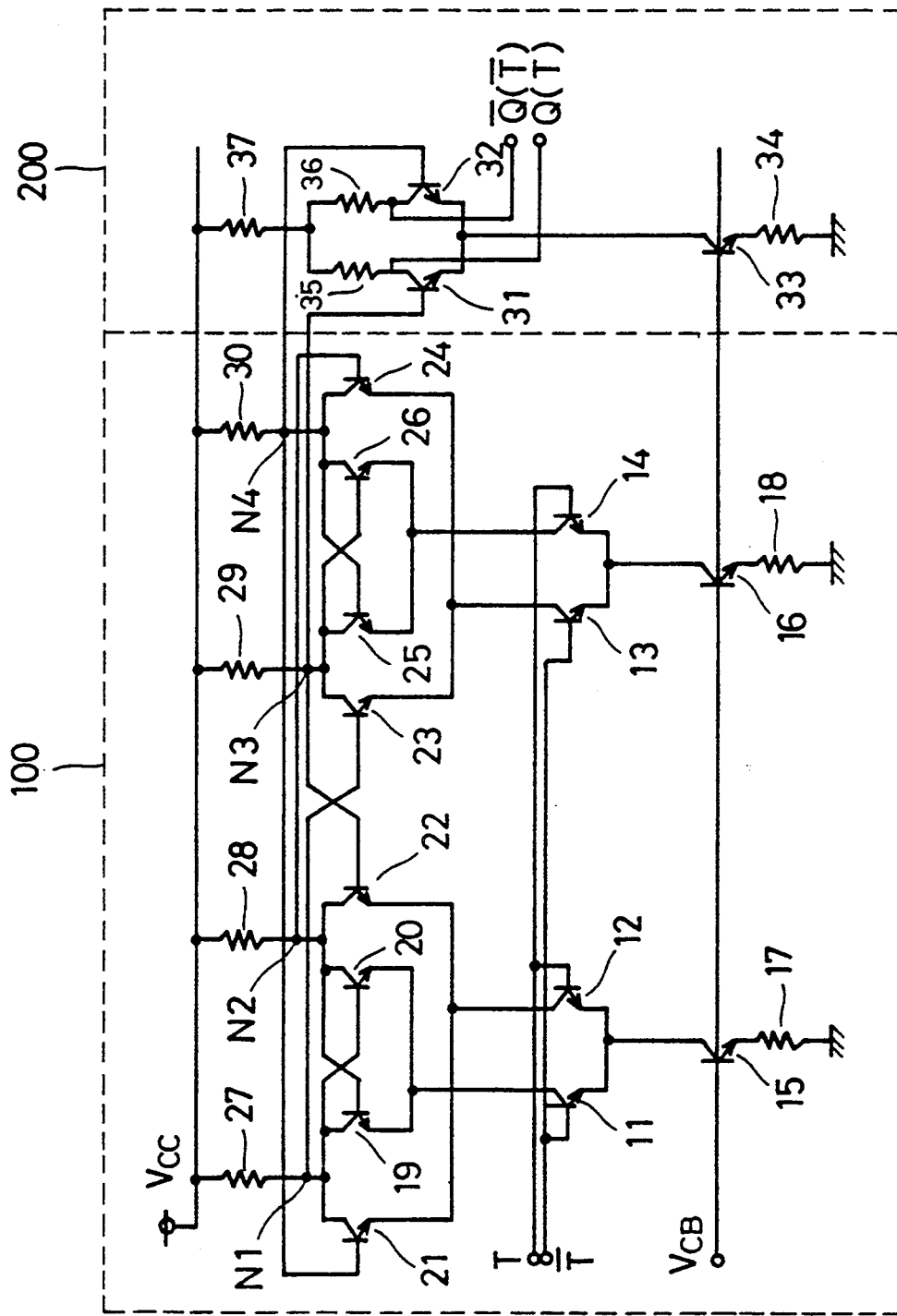
FIG. 1 is a circuit diagram of a flip-flop circuit of an ECL structure according to a preferred embodiment of the present invention.

FIG. 1 is a circuit diagram of a flip-flop circuit of an ECL structure according to a preferred embodiment of the present invention. The flip-flop circuit comprises an ECL circuit portion 100 and a buffer circuit portion 200. The structure of the ECL circuit portion 100 of the present preferred embodiment is identical with that of the ECL circuit portion 100 of the conventional flip-flop circuit 2 of FIG. 6, and the description thereof will be omitted herein.

The buffer circuit portion 200 comprises a differential pair of NPN transistors 31 and 32. The base of the transistor 31 is connected to the node N3 in the ECL circuit portion 100, and the base of the transistor 32 is connected to the node N4 in the ECL circuit portion 100. The emitters of the transistors 31 and 32 are connected in common, and the common connection is grounded through a constant-current source NPN transistor 33 and a resistor 34. The base of the transistor 33 is connected to the $V_{CB}$ terminal in common with the bases of the transistors 15 and 16. The collector of the transistor 31 is connected to a Q output terminal and to a first end of a resistor 35. The collector of the transistor 32 is connected to a $\overline{Q}$ output terminal and to a first end of a resistor 36. Second ends of the resistors 35 and 36 are connected in common, and the common connection is connected to the power supply potential $V_{CC}$ through a resistor 37.

The buffer circuit portion 200 operates as an inverting buffer circuit which inverts the polarity of signals at the nodes N3 and N4 to output the resultant signals to the Q and $\overline{Q}$ output terminals. For this purpose, the connection between the nodes N3, N4 and the outputs Q, $\overline{Q}$ in the flip-flop circuit of FIG. 1 is in reversed relation to the connection therebetween in the flip-flop circuit of FIG. 6.

The operation of the flip-flop circuit of FIG. 1 is classified into four modes to be described below.

In a first mode, input/output levels are as follows: T="L", $\overline{T}$="H", Q="L", and $\overline{Q}$="H". At that time, the transistors 11, 13, 19, 24 and 31 turn on. This provides a current path of resistor 27—transistor 19—transistor 11—transistor 15—resistor 17, a current path of resistor 30—transistor 24—transistor 13—transistor 16—resistor 18, and a current path of resistor 37—resistor 35—transistor 31—transistor 33—resistor 34. The levels at the nodes N1, N2, N3 and N4 are "L", "H", "H" and "L", respectively.

In a second mode, input/output levels are as follows: T="H", $\overline{T}$="L", Q="L", and $\overline{Q}$="H". At that time, the transistors 12, 14, 22, 26 and 31 turn on. This provides a current path of resistor 28—transistor 22—transistor 12—transistor 15—resistor 17, a current path of resistor 30—transistor 26—transistor 14—transistor 16—resistor 18, and a current path of resistor 37—resistor 35—transistor 31—transistor 33—resistor 34. The levels at the nodes N1, N2, N3 and N4 are "H", "L", "H" and "L", respectively.

In a third mode, input/output levels are as follows: T="L", $\overline{T}$="H", Q="H", and $\overline{Q}$="L". At that time, the transistors 11, 13, 20, 23 and 32 turn on. This provides a current path of resistor 28—transistor 20—transistor 11—transistor 15—resistor 17, a current path of resistor 29—transistor 23—transistor 13—transistor 16—resistor 18, and a current path of resistor 37—resistor 36—transistor 32—transistor 33—resistor 34. The levels at the nodes N1, N2, N3 and N4 are "H", "L", "L" and "H", respectively.

In a fourth mode, input/output levels are as follows: T="H", $\overline{T}$="L", Q="H", and $\overline{Q}$="L". At that time, the transistors 12, 14, 21, 25 and 32 turn on. This provides a current path of resistor 27—transistor 21—transistor 12—transistor 15—resistor 17, a current path of resistor 29—transistor 25—transistor 14—transistor 16—resistor 18, and a current path of resistor 37—resistor 36—transistor 32—transistor 33—resistor 34. The levels at the nodes N1, N2, N3 and N4 are "L", "H", "L" and "H", respectively.

By repeating the first to fourth modes in order, the signals inputted to the T and $\overline{T}$ input terminals are frequency-divided to half, and the resultant signals are outputted from the Q and $\overline{Q}$ output terminals. In the frequency divider of FIG. 3, for example, the signals at the Q and $\overline{Q}$ output terminals are inputted to the T and $\overline{T}$ input terminals of the succeeding flip-flop circuit. A need exists at that time for provision of the Q and $\overline{Q}$ output signals at a potential level which does not allow the respective transistors of the succeeding flip-flop circuit to be saturated in the same fashion as the conventional circuit of FIG. 4, which will be described below.

The value of current flowing in the constant-current source transistor 33 is designated by I, the respective resistance of the resistors 35 and 36 is designated by $R_W$, and the resistance of the resistor 37 is designated by $R_L$. Voltage levels $V_{Q(H)}$ and $V_{Q(L)}$ of the "H" and "L" level signals outputted to the Q (or $\overline{Q}$) output terminal are, respectively:

$$V_{Q(H)} = V_{CC} - IR_L \quad (13)$$

$$V_{Q(L)} = V_{CC} - IR_L - IR_W \quad (14)$$

It will be appreciated from Expressions (13) and (14) that the potential level of the output signal can be set to any level by varying the resistance $R_L$ of the resistor 37. The logical amplitude of the output signal can be set to any level by varying the resistance $R_W$ of the resistors 35 and 36. The value of current I flowing in the constant-current source transistor 33 is appropriately set by varying the resistance of the resistor 34.

In the second mode, for example, the voltage $V_{Q(H)}$ is inputted to the T input terminal, and the voltage $V_{Q(L)}$ is inputted to the $\overline{T}$ input terminal. At this time, an emitter potential $V_{E12}$ of the transistor 12 is:

$$V_{E12} = V_{Q(H)} - V_{BE} = V_{CC} - IR_L - V_{BE} \quad (15)$$

Taking into consideration a base-emitter voltage $V_{BE}$ of the transistor 22 that is on, a collector potential $V_{C12}$ of the transistor 12 is:

$$V_{C12} = V_{CC} - V_{BE} \quad (16)$$

From Expressions (15) and (16), a collector-emitter voltage $V_{CE12}$ of the transistor 12 is given as:

$$V_{CE12} = V_{C12} - V_{E12} = -IR_L \quad (17)$$

In order that the transistor 12 is not saturated but operates in the active region, it is necessary to satisfy the following condition:

$$V_{CE12} > V_{SAT} \quad (18)$$

From Expression (17) it is required that:

$$IR_L > V_{SAT} \quad (19)$$

In general, the saturation voltage $V_{SAT}$ of transistors is $V_{SAT} = 0.3$ V. From Expression (19) it is required that:

$$IR_L > 0.3 (V) \quad (20)$$

This is the first requirement. Since the resistance $R_L$ of the resistor 37 must not be zero, the resistor 37 must be provided in the circuit of FIG. 1.

On the other hand, a collector potential $V_{C15}$ of the transistor 15 is:

$$V_{C15} = V_{E12} = V_{CC} - IR_L - V_{BE} \quad (21)$$

An emitter potential $V_{E15}$ of the transistor 15 is:

$$V_{E15} = V_{CB} - V_{BE} \quad (22)$$

Thus a collector-emitter voltage $V_{CE15}$ of the transistor 15 is given as:

$$V_{CE15} = V_{C15} - V_{E15} = V_{CC} - IR_L - V_{CB} \quad (23)$$

For non-saturation of the transistor 15, it is necessary to satisfy the following condition:

$$V_{CE15} > V_{SAT} \quad (24)$$

From Expression (23) it is required that:

$$IR_L < V_{CC} - V_{CB} - V_{SAT} \quad (25)$$

Figure 6:
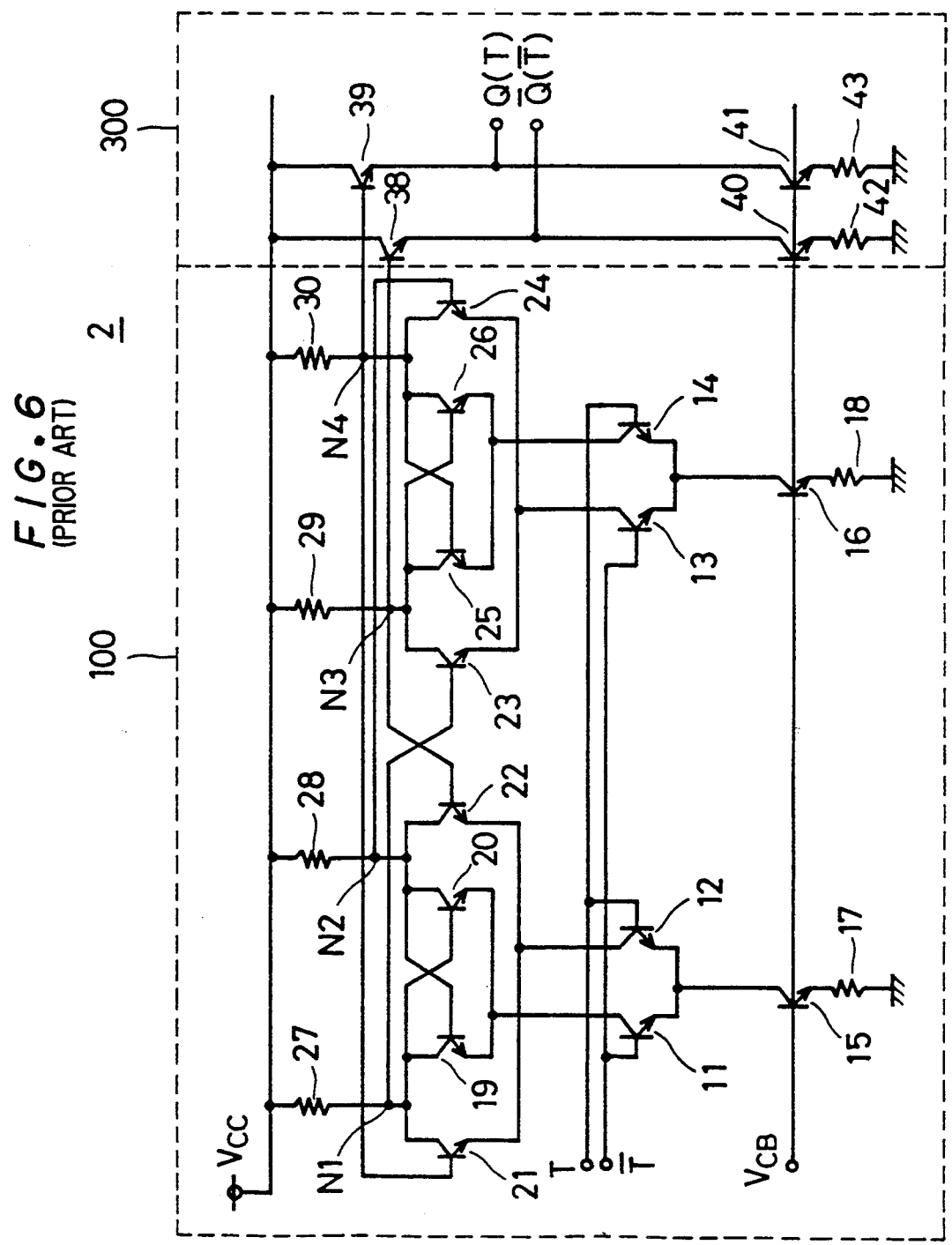
FIG. 6 is a circuit diagram of a conventional flip-flop circuit of an ECL structure.
Figure 7:
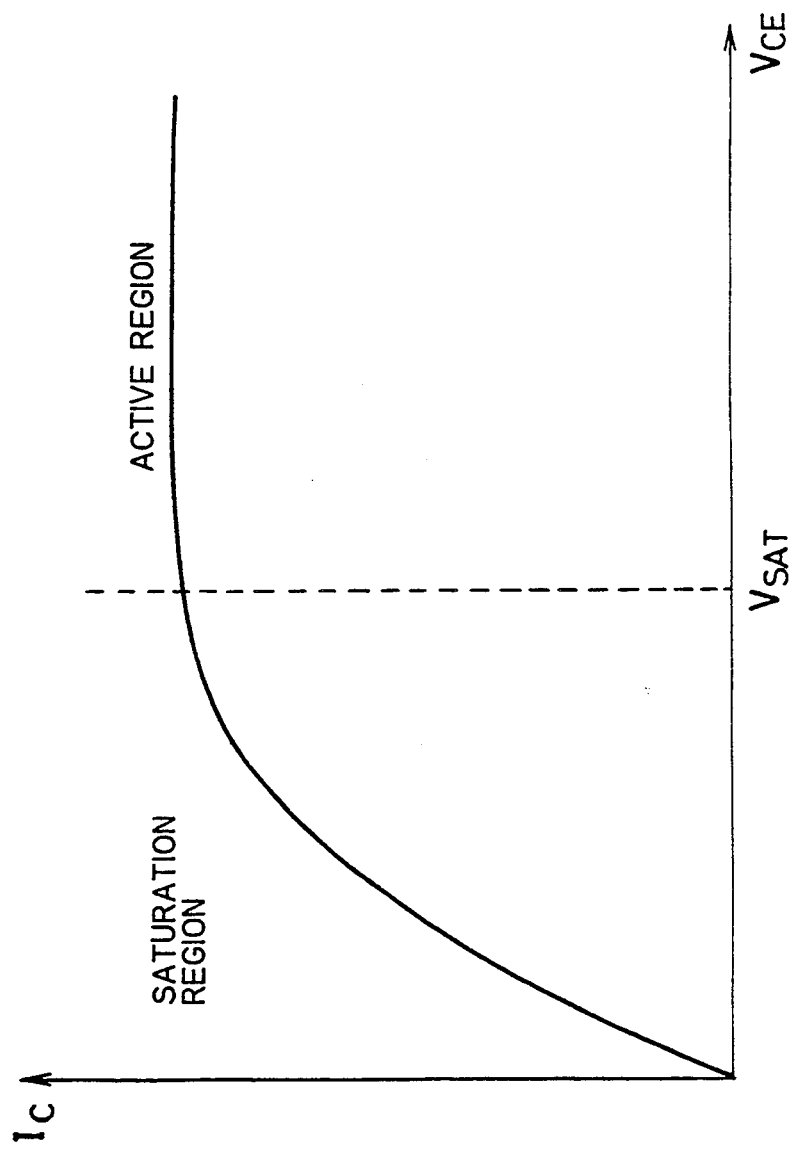
FIG. 7 is a graph showing a general characteristic of transistors.
Figure 8:
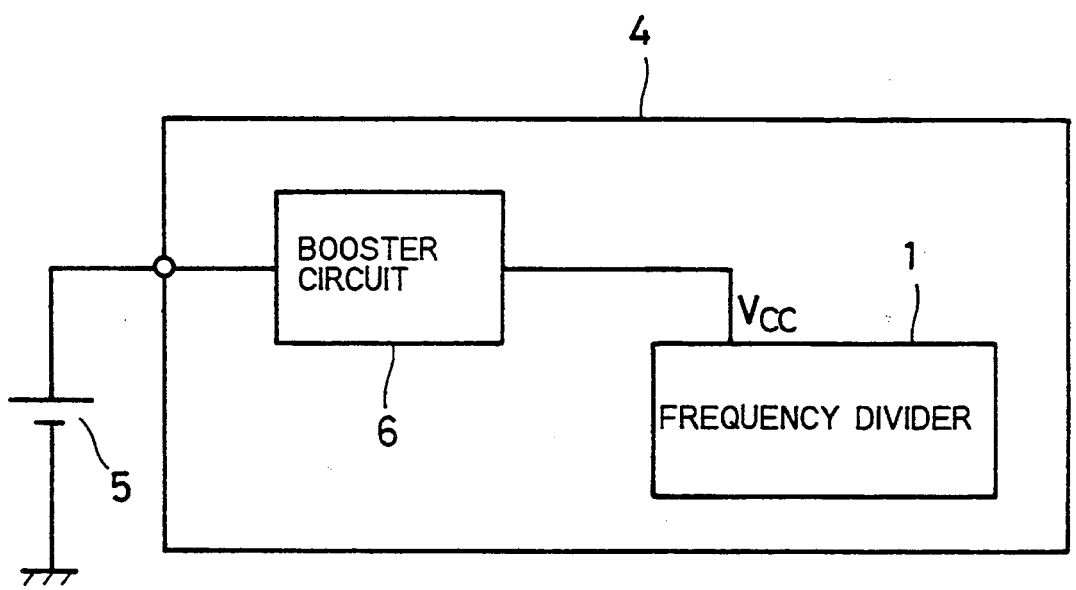
FIG. 8 is a block diagram of a device comprising a frequency divider including a conventional ECL circuit.

It is assumed that $V_{CB} = 1$ V, $V_{BE} = 0.75$ V, and $V_{SAT} = 0.3$ V in the same manner as the description with reference to FIG. 6. From Expression (25) is derived:

$$IR_L < V_{CC} - 1 - 0.3 = V_{CC} - 1.3 (V) \quad (26)$$

This is the second requirement.

From the first and second requirements indicated by Expressions (20) and (26), in order that the transistors of the flip-flop circuit of FIG. 1 are not saturated but operate in the active region, it is necessary to satisfy the following condition:

$$0.3 (V) < IR_L < V_{CC} - 1.3 (V) \quad (27)$$

To satisfy Expression (27) constantly, it required is that:

$$V_{CC} > 1.6 (V) \quad (28)$$

That is, the flip-flop circuit of FIG. 1 is able to be placed in normal operation where the power source voltage $V_{CC}$ is more than 1.6 V.

Although the foregoing description is associated with the transistor 12, the same is true for the other transistors 11, 13, and 14.

Figure 2:
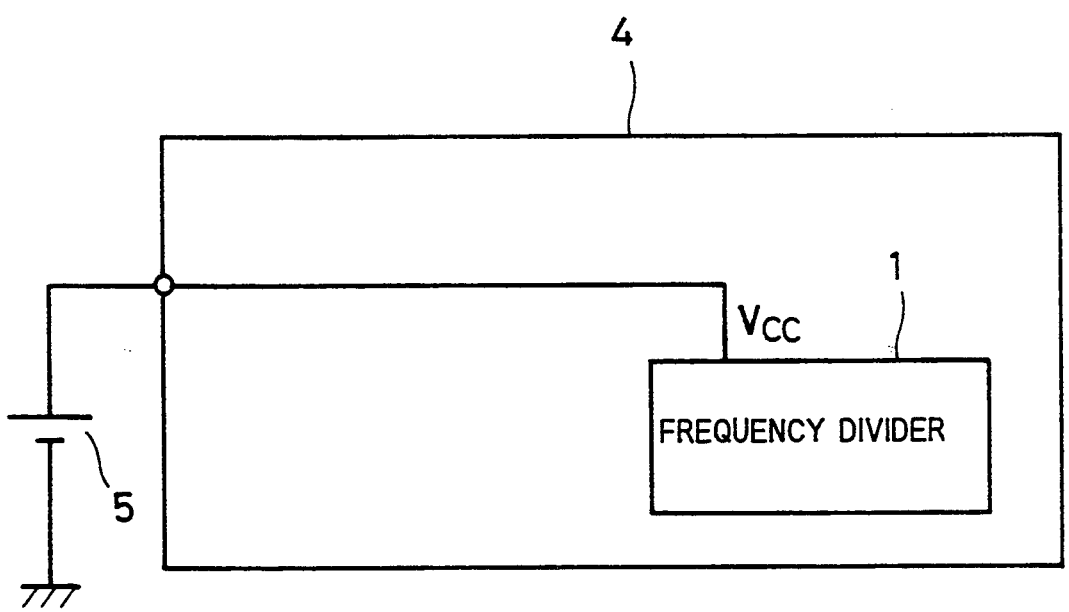
FIG. 2 is a block diagram of a device comprising a frequency divider including an ECL circuit according to the present invention.

The flip-flop circuit of FIG. 1 is permitted to operate at an extremely low voltage as compared with the conventional circuit of FIG. 6 having the requirement of $V_{CC} > 2.05$ V. A frequency divider 1 in a device 4 is therefore driven without a booster circuit if an external battery 5 of the device 4 has a relatively low voltage, as shown in FIG. 2.

Figure 3:
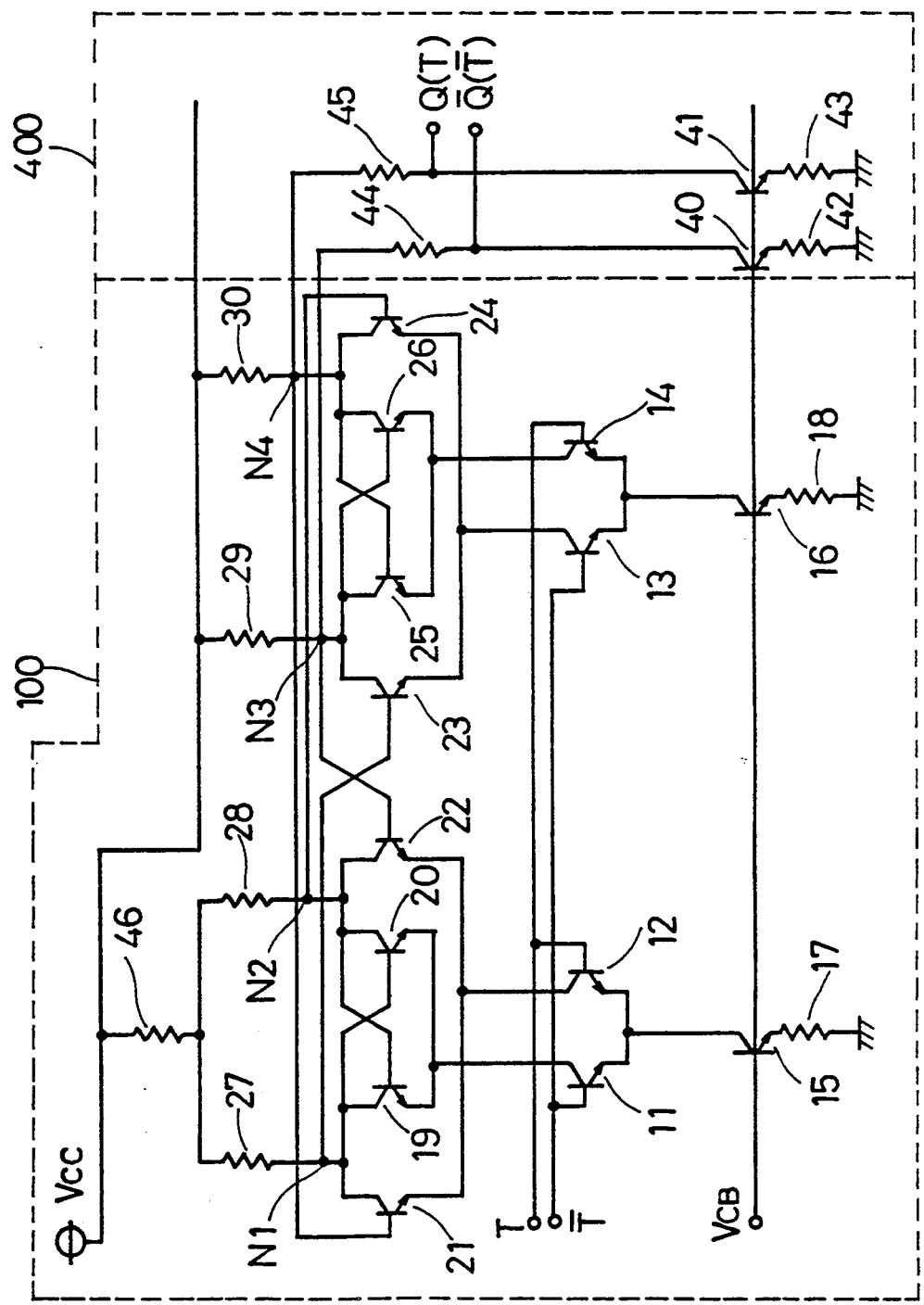
FIG. 3 is a circuit diagram of a flip-flop circuit of ECL structure according to another preferred embodiment of the present invention.

FIG. 3 is a circuit diagram of a flip-flop circuit of an ECL structure according to another preferred embodiment of the present invention. The flip-flop circuit of FIG. 3 comprises the ECL circuit portion 100 and a level shift circuit portion 400. The structure of the ECL circuit portion 100 of FIG. 3 is substantially identical with that of the ECL circuit portion 100 of the conventional flip-flop circuit 2 of FIG. 6 except that the first ends of the resistors 27 and 28 in the master portion are connected in common to a resistor 46 in the ECL circuit portion 100 of FIG. 3. A second end of the resistor 46 is connected to the power supply voltage $V_{CC}$.

The level shift circuit portion 400 includes resistors 44 and 45. A first end of the resistor 44 is connected to the node N3 in the ECL circuit portion 100, and a first end of the resistor 45 is connected to the node N4 in the ECL circuit portion 100. A second end of the resistor 44 is grounded through a constant-current source NPN transistor 40 and a resistor 42. A second end of the resistor 45 is grounded through a constant-current source NPN transistor 41 and a resistor 43. The bases of the transistors 40 and 41 are connected to the $V_{CB}$ terminal in common with the bases of the transistors 15 and 16. The collector of the transistor 40 is connected to the $\overline{Q}$ output terminal. The collector of the transistor 41 is connected to the Q output terminal.

The respective value of currents flowing in the constant-current source transistors 15, 16, 40, 41 is designated by I, the respective resistance of the resistors 27 to 30 is designated by $R_W$, and the respective resistance of the resistors 44 and 45 is designated by $R_A$. Voltages levels $V_{Q(H)}$ and $V_{Q(L)}$ of the "H" and "L" level signals outputted to the Q (or $\overline{Q}$) output terminal are, respectively:

$$V_{Q(H)} = V_{CC} - IR_W - IR_A \quad (29)$$

$$V_{Q(L)} = V_{CC} - 2IR_W - IR_A \quad (30)$$

The potential level of the output signal can be set to any level by varying the resistances $R_W$ and $R_A$. The resistance $R_W$ is also used for setting the logical amplitude to any level. The current values I of the respective constant-current source transistors 15, 16, 40, 41 are appropriately set by varying the resistances of the resistors 17, 18, 42, 43, respectively.

It is assumed that the voltages $V_{Q(H)}$ and $V_{Q(L)}$ are inputted to the T and $\overline{T}$ input terminals, respectively. At this time, the emitter potential $V_{E12}$ of the transistor 12 is:

$$V_{E12} = V_{Q(H)} - V_{BE} = V_{CC} - I(R_W + R_A) - V_{BE} \quad (31)$$

Taking into consideration the base-emitter voltage $V_{BE}$ of the transistor 22 that is on, the collector potential $V_{C12}$ of the transistor 12 is:

$$V_{C12} = V_{CC} IR_W - V_{BE} \quad (32)$$

From Expressions (31) and (32), the collector-emitter voltage $V_{CE12}$ of the transistor 12 is given as:

$$V_{CE12} = V_{C12} - V_{E12} = IR_A \quad (33)$$

In order that the transistor 12 is not saturated but operates in the active region, it is necessary to satisfy the following condition:

$$V_{CE12} > V_{SAT} \quad (34)$$

From Expression (33) it is required that:

$$IR_A > V_{SAT} \quad (35)$$

In general, the saturation voltage $V_{SAT}$ of transistors is $V_{SAT} = 0.3$ V. From Expression (35), it is necessary to satisfy the following condition:

$$I R_A > 0.3(V) \quad (36)$$

This is the first requirement.

On the other hand, the collector potential $V_{C15}$ of the transistor 15 is:

$$V_{C15} = V_{E12} = V_{CC} - I(R_W + R_A) - V_{BE} \quad (37)$$

The emitter potential $V_{E15}$ of the transistor 15 is:

$$V_{E15} = V_{CB} - V_{BE} \quad (38)$$

Thus the collector-emitter voltage $V_{CE15}$ of the transistor 15 is given as:

$$V_{CE15} = V_{C15} - V_{E15} = V_{CC} - I(R_W + R_A) - V_{CB} \quad (39)$$

For non-saturation of the transistor 15, it is necessary to satisfy the following condition:

$$V_{CE15} > V_{SAT} \quad (40)$$

From Expression (39) it is required that:

$$I(R_W + R_A) < V_{CC} - V_{CB} - V_{SAT} \quad (41)$$

It is assumed that $V_{CB} = 1$ V, $V_{BE} = 0.75$ V, and $V_{SAT} = 0.3$ V. From Expression (41) is derived:

$$I(R_W + R_A) < V_{CC} - 1.3(V) \quad (42)$$

This is the second requirement.

To unify the "H" and "L" level potentials of the base input of the transistors 19, 20, 21, .9 23 24, 25, 26 in the ECL circuit portion 100, the resistance of the resistor 46 is supposed to be equal to the resistances of the resistors 27, 28, 29, 30.

From the first and second requirements indicated by Expressions (36) and (42), in order that the respective transistors of the flip-flop circuit of FIG. 3 are not saturated but operate in the active region, it is necessary to satisfy the following condition:

$$0.3(V) < IR_A < V_{CC} - IR_W - 1.3(V) \quad (43)$$

In general, the value $I R_W$ is about 0.3 V. In order that Expression (43) is constantly satisfied, it required is that:

$$V_{CC} > 1.9(V) \quad (44)$$

That is, the flip-flop circuit of FIG. 3 is enabled to be placed in normal operation where the power source voltage $V_{CC}$ is more than 1.9 V.

Although the foregoing description is associated with the transistor 12, the same is true for other transistors 11, 13, 14.

The flip-flop circuit of FIG. 3 is permitted to operate at a lower voltage as compared with the conventional circuit of FIG. 6 having the requirement of $V_{CC} > 2.05$ V. The frequency-divider 1 in the device 4 is therefore driven without a booster circuit if the external battery 5 of the device 4 has a relatively low voltage, as shown in FIG. 2.

Figure 4:
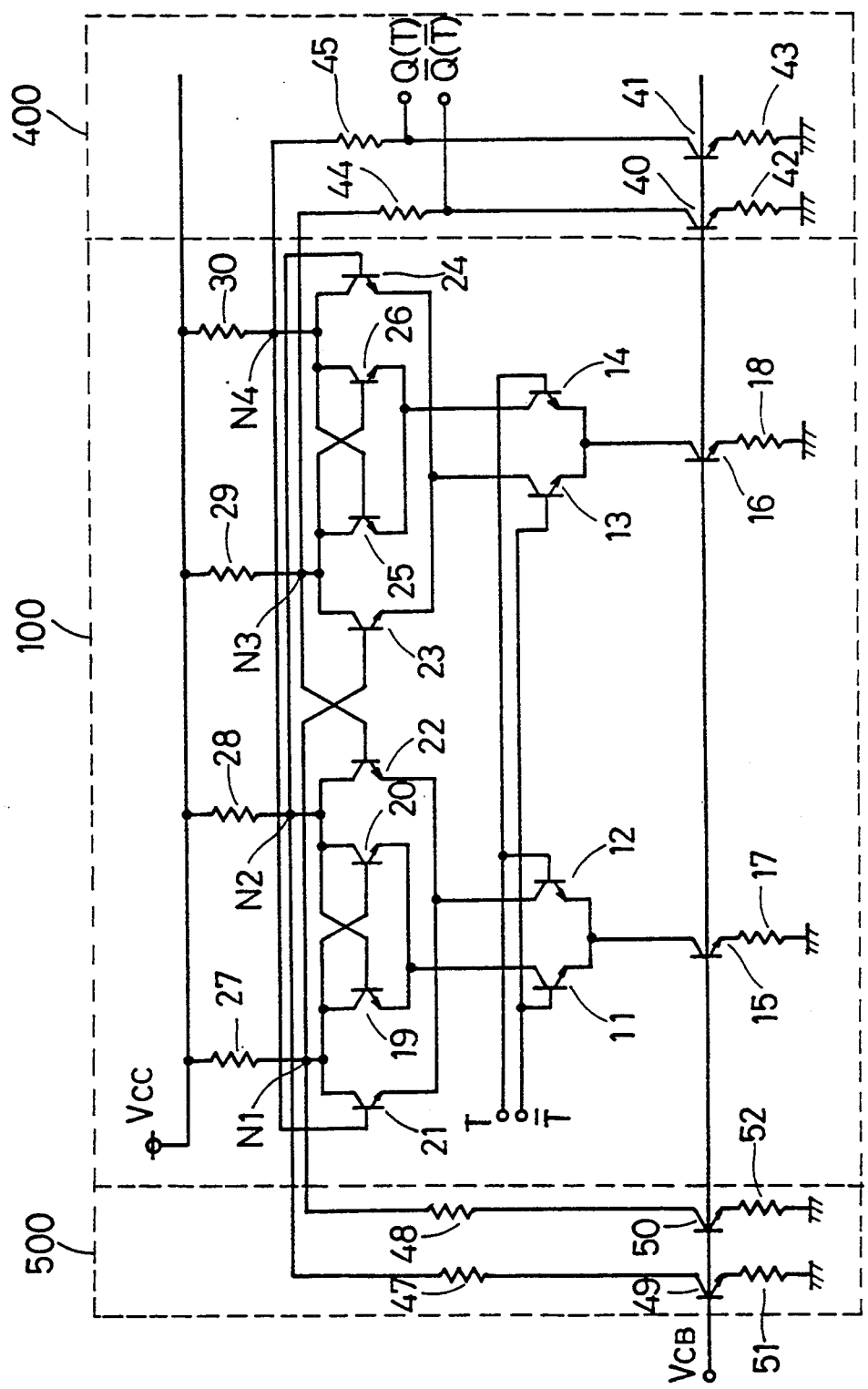
FIG. 4 is a circuit diagram of a flip-flop circuit of ECL structure according to still another preferred embodiment of the present invention.
Figure 5:
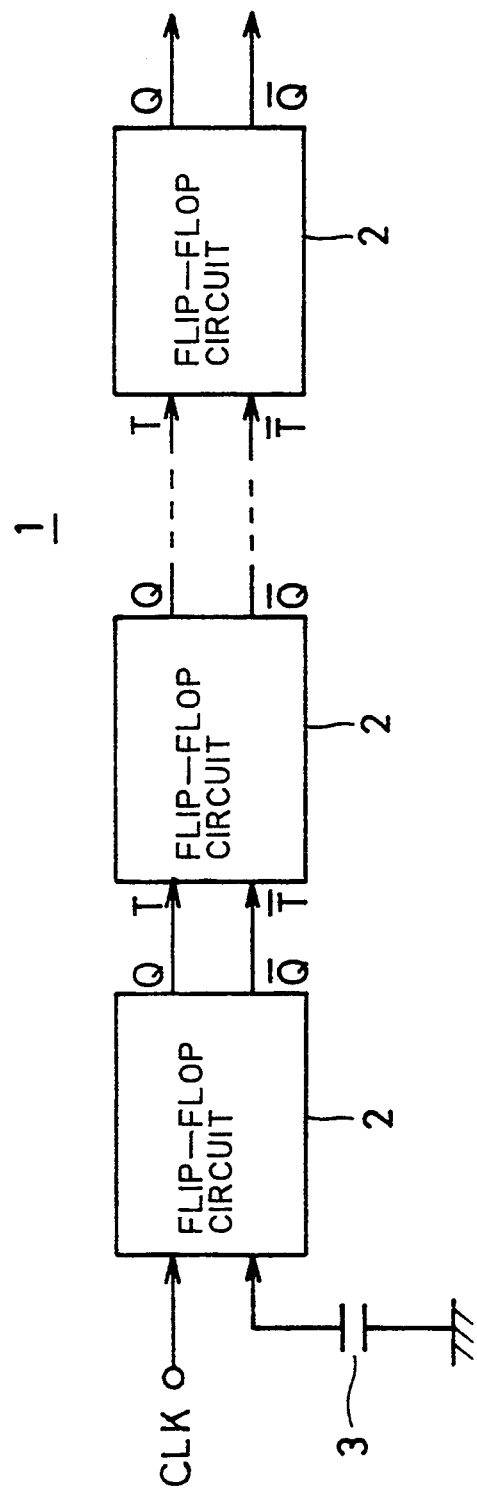
FIG. 5 is a block diagram of a conventional frequency divider.

FIG. 4 is a circuit diagram of a flip-flop circuit of ECL structure according to still another preferred embodiment of the present invention. The flip-flop circuit of FIG. 4 comprises a level shift circuit portion 500 in place of the resistor 46 of the flip-flop circuit of FIG. 3. The structure of the level shift circuit portion 500 and the resistances of resistors 47, 48, 51, 52 are identical with those in the level shift circuit portion 400. A first end of the resistor 47 in the level shift circuit portion 500 is connected to the node N2, and a first end of the resistor 48 is connected to the node N1. The resistors 47 and 48 are not necessary in this embodiment and may be eliminated, if desired.

The respective currents flowing in the transistors 15, 16, 40, 41, 49, 50 are designated by I, the respective resistance of the resistors 27, 28, 29, 30 are designated by $R_W$, and the respective resistance of the resistors 44, 45, 47, 48 is designated by $R_A$. Expressions (29) to (44) hold in the same manner as in the preferred embodiment of FIG. 3. Thus the same effects as achieved in the preferred embodiment of FIG. 3 are provided in this preferred embodiment of FIG. 4. It should be noted that the level shift circuit portion 500 is to unify the "H" and "L" potentials of the base input of the transistors 19 to 26.

While the invention has been shown and described in detail, the foregoing description is in all aspects illustrative and not restrictive. It is therefore understood that numerous modifications and variations can be devised without departing from the scope of the invention.

What is claimed is:

1. An ECL circuit comprising:
    an ECL circuit portion having an ECL structure without emitter follower output transistors for deriving first and second differential signals; and
    a level shift circuit portion for level-shifting said first and second signals to output the level-shifted first and second signals wherein said level-shift circuit portion includes:
    a first resistor having a first and directly receiving, without buffering, said first signal;
    a second resistor having a first end directly receiving, without buffering, said second signal;
    a first constant-current source connected to a second end of said first resistor: and
    a second constant-current source connected to a second end of said second resistor.

2. The ECL circuit of claim 1, wherein
    said first and second constant-current sources include first and second constant-current source transistors, respectively,
    said ECL circuit portion includes a master portion, a slave portion, and third and fourth constant-current source transistors for applying an operating bias current to said master and slave portions, respectively, and said first, second, third and fourth constant-current source transistors include control electrodes connected in common to a predetermined control potential.

3. The ECL circuit of claim 1, wherein said ECL circuit portion includes a master portion, a slave portion, and a power supply line for supplying a predetermined power supply potential, and said master portion includes first and second signal output ends for outputting opposite-polarity signals, a first resistor having a first end connected to said first signal output end, a second resistor having a first end connected to said second signal output end, and a third resistor having a first end connected in common to second ends of said first and second resistors and a second end connected to said power supply line.

4. The ECL circuit of claim 3, wherein said slave portion includes first and second signal output ends for outputting opposite-polarity signals, a fourth resistor connected between said first signal output end of said slave portion and said power supply line, and a fifth resistor connected between said second signal output end of said slave portion and said power supply line, and said first, second, third, fourth and fifth resistors have an equal resistance.

5. The ECL circuit of claim 1, wherein said ECL circuit portion includes a master portion and a slave portion, said master portion includes first and second signal output ends for outputting opposite-polarity signals, and said ECL circuit further includes a second level shift circuit connected to said first and second signal output ends for controlling levels of said opposite-polarity signals outputted from said first and second signal output ends.

6. The ECL circuit of claim 5, wherein said second level shift circuit includes:

a first resistor having a first end directly receiving, without buffering, one of said opposite-polarity signals;

a second resistor having a first end directly receiving, without buffering, the other opposite-polarity signal;

a first constant-current source connected to a second end of said first resistor; and a second constant-current source connected to a second end of said second resistor.

7. An ECL circuit, comprising:

an ECL circuit portion having an ECL structure without emitter follower output transistors for deriving first and second differential signals; and a level shift circuit portion for level-shifting said first and second signals to output the level-shifted first and second signals wherein said level shift circuit portion includes:

a first resistor having a first end directly receiving, without any intervening elements, said first signal;

a second resistor having a first end directly receiving, without any intervening elements, said second signal;

a first constant-current source connected to a second end of said first resistor; and a second constant-current source connected to a second end of said second resistor.

* * * * *